FREQUENCY DISCRIMINATOR CIRCUIT

Filed April 22, 1963

INVENTOR.
SAMUEL L. BROADHEAD JR.
BY
Moody and Kintzinger
ATTORNEYS

United States Patent Office 3,204,190
Patented Aug. 31, 1965

3,204,190
FREQUENCY DISCRIMINATOR CIRCUIT
Samuel L. Broadhead, Jr., Cedar Rapids, Iowa, assignor to Collins Radio Company, Cedar Rapids, Iowa, a corporation of Iowa
Filed Apr. 22, 1963, Ser. No. 274,740
9 Claims. (Cl. 329—119)

Figures 1, 2, 3:
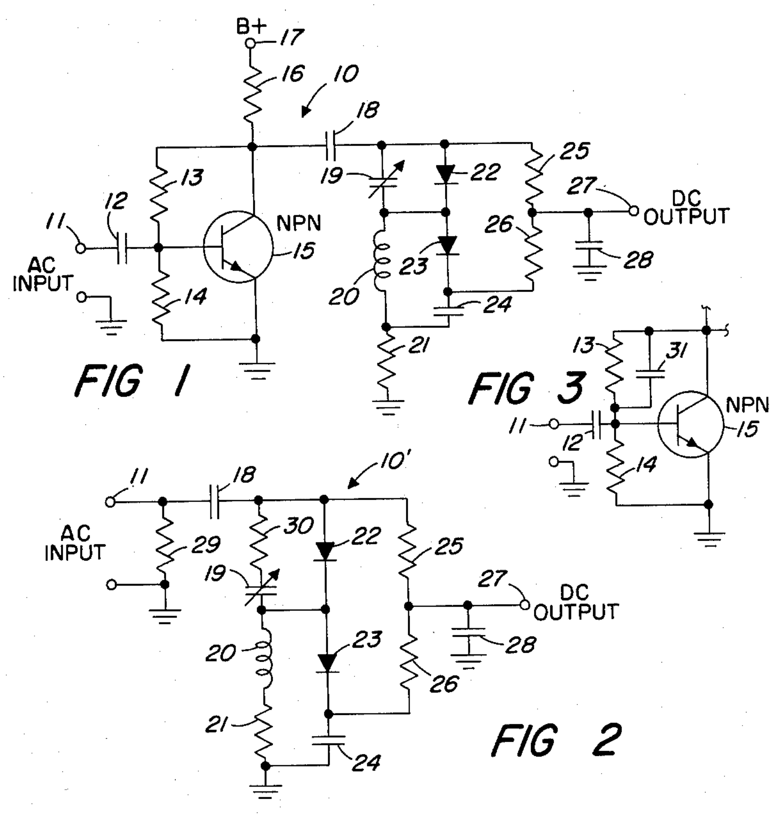

This invention relates in general to frequency discriminator circuits, and in particular to such a circuit with a series resonant inductive-capacitive tuned single subcircuit, and without a tapped coil. It is also directed further to a frequency discriminator circuit having input signal amplification with relatively high negative feedback at harmonics of the series resonant discriminator center frequency.

There are many frequency modulation discriminators presently in use with less sensitivity around the center frequency than desired and perhaps less than necessary for some applications. Many of these discriminator circuits lack the ability to maintain output voltage at frequencies much removed from the center frequency. Furthermore, many of these same discriminators are relatively complex and expensive with requirements for more components than desired. In addition, some of these discriminators are driven from a high impedance source with respect to the load impedance and are not readily adapted to solid state circuitry. A further problem is that of harmonic content and distortion in input signal waveforms at times beyond the capabilities of some discriminators and particularly so with many of those having no counteracting circuit correction provisions for minimizing the effect of such distortion.

It is, therefore, a principal object of this invention to provide an improved discriminator circuit providing higher sensitivity around the center frequency and having the ability to maintain output voltage at frequencies greatly removed from the center frequency.

Another object is to provide a discriminator utilizing two reactive impedances (an inductor and a capacitor) in series for developing signal phase shift with each of the two impedance values changing oppositely with frequency change for increased center frequency sensitivity and for maintaining output voltage through extended frequency ranges greatly removed from the center frequency.

A further object is to provide such a frequency discriminator circuit not requiring a tapped coil, that is more reliable, considerably simplified, and less expensive, requiring fewer components, than many discriminators.

Still another object is to correct for, and substantially counteract, harmonic distortion in an A.C. signal input to a discriminator circuit and to simultaneously stabilize bias and collector current of an input signal amplifying and coupling transistor.

Features of this invention useful in accomplishing the above objects include the use of a capacitor and an inductance coil in series between a signal input coupling capacitor and ground, connected in parallel with two serially connected diodes and a capacitor, with the diodes connected cathode-to-anode, and with the common junction of the serially connected capacitor and inductance coil connected to the common junction of the diodes. Two substantially equal resistors are connected across the two diodes for developing a D.C. voltage output at their common junction. This discriminator develops substantially zero output voltage, at the output point of the junction of the two resistors when the input signal is at the desired center frequency and with series resonance of the series connected capacitor and inductance coil circuit. The discriminator develops a positive voltage at lower frequencies than the designed center frequency and negative voltages at higher frequencies, or the reverse, depending upon the anode-to-cathode orientation of the diodes. A feature of an additional refinement to the frequency discriminator circuit is an A.C. input signal amplifying and coupling transistor circuit connected to the above-mentioned signal input coupling capacitor. This circuit includes three series connected resistors between a voltage supply and ground with the junction of the first and second resistors connected to the collector of the transistor, the junction of the second and third resistors connected to the base of the transistor, and with the third resistor connected between the transistor base and ground together with the transistor emitter connected to ground. An A.C. input applied to the base of the transistor, including undesired harmonic distortion is subject to corrective negative feedback from the series resonant circuit and the collector of the transistor. At the operating center frequency, the coil and capacitor are series resonant and, although individual voltages across each are high, the voltage from collector to ground is low; therefore, negative feedback at this frequency is low. At a harmonic of this frequency, the reactance of the coil and capacitor in series is much higher; therefore a relatively much higher voltage appears at the collector with a corresponding much higher negative feedback.

Specific embodiments representing what are presently regarded as the best modes of carrying out the invention are illustrated in the accompanying drawing.

Figure 4:
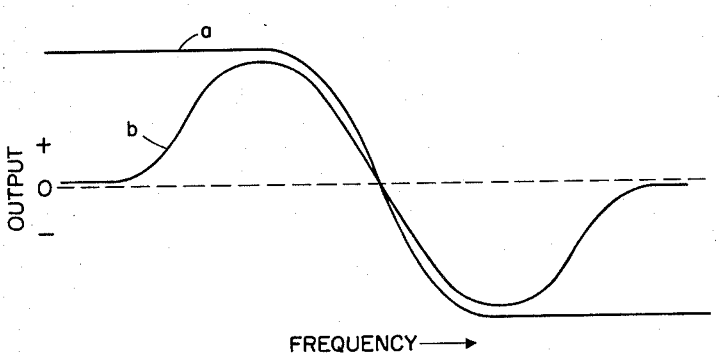

In the drawing:

FIGURE 1 represents a frequency discriminator using a series resonant inductive coil and capacitor circuit for developing a frequency discriminator output, and having an A.C. input signal amplifying and coupling transistor circuit with harmonic distortion negative feedback;

FIGURE 2, the basic series resonant capacitor and inductive coil discriminator circuit of FIGURE 1 without the input signal amplifying and coupling transistor and without negative signal feedback;

FIGURE 3, the frequency discriminator of FIGURE 1 with a capacitor added between the collector and base of the transistor for improved phasing of the negative feedback for finer harmonic distortion correction; and FIGURE 4, a comparison between the output of frequency discriminators, according to the invention, compared to a typical output curve of many other frequency discriminators.

Referring to the drawing:

The frequency discriminator 10 of FIGURE 1 is shown to have an A.C. input terminal means 11 connected serially through a direct current blocking capacitor 12, and the junction between resistors 13 and 14 to the base of NPN transistor 15. Resistors 13 and 14 along with resistor 16 form a D.C. voltage divider connected between a positive voltage supply terminal 17 and ground to provide biasing voltage for A.C. input signal amplifying and coupling transistor 15 with the common junction of resistors 16 and 13 connected to the collector, the junction of resistors 13 and 14 connected to the base, and with the emitter of the transistor connected to ground.

The output collector of transistor 15 is connected to and through signal coupling capacitor 18 to a series resonant adjustable capacitor 19 and inductive coil 20 subcircuit connected between the coupling capacitor 18 and ground. An optional resistor 21 connected between the capacitor 19 and coil 20 subcircuit and ground may be included for reducing Q and broadening circuit frequency response of the series resonant subcircuit. Two solid state diodes 22 and 23 are connected in series along with capacitor 24 between the coupling capacitor 18 and the junction of the capacitor 19-coil 20 subcircuit with resistor 21. The common junction between the diodes 22 and 23 is connected to the common junction of the adjustable capacitor 19 and the inductive coil 20. Furthermore, although diodes 22 and 23 are both shown to be connected anodes toward capacitor 18 and cathodes toward capacitor 24, they could be reversed as long as their common connection was from the cathode of one to the anode of the other. Two substantially equal resistors 25 and 26 are series connected between the anode of one of the diodes 22 and 23 and the cathode of the other diode. The common junction of resistors 25 and 26 is connected to an output terminal 27 and through capacitor 28 to ground in order that a D.C. voltage output developed at the junction of resistors 25 and 26 may be applied to utilizing means as desired.

In the embodiment of FIGURE 2, the transistor 15 signal amplifying and coupling circuit of FIGURE 1 is replaced by a resistor 29 connected between a common junction, of A.C. input terminal means 11 and coupling capacitor 18, and ground. The series resonant subcircuit and other components of the FIGURE 2 frequency discriminator 10′ are the same as the corresponding portions of the frequency discriminator 10 of FIGURE 1, with several exceptions, and components duplicating those in the embodiment of FIGURE 1 are, for the sake of convenience, numbered the same. In this embodiment, an optional resistor 30 is added between coupling capacitor 18 and the adjustable capacitor 19 for further reduction of Q. Furthermore, capacitor 24 is connected directly to ground instead of to the common junction of resistor 21 and coil 20. Even so, resistor 21 still reduces Q and broadens frequency response of the series resonant subcircuit much the same as with the FIGURE 1 embodiment.

In operation, A.C. signals passed through capacitor 18 are applied to the series resonant circuit including capacitor 19 and inductive coil 20. This series resonant circuit offers very low impedance to those ac currents whose frequencies are at, or near, the resonant frequency of the circuit and a very high impedance to the ac currents of all other frequencies. Further, with the very low impedance to those A.C. current frequencies at, or near, the resonant frequency of the circuit the A.C. voltage developed across the circuit is at a minimum at series resonant frequency while the individual impedance of both individual reactances, the capacitor and the inductor, is high, substantially equal, and opposite to each other. This provides a much higher degree of sensitivity around the center frequency of the device since the impedance values of the capacitor 19 and the inductor coil 20 to change oppositely with frequency change. Further, with the orientation of diodes 22 and 23 in the circuit of FIGURE 2 frequencies below the center frequency of the discriminator result in greater A.C. impedance and larger A.C. voltage drop across the capacitor 19 than across the inductive coil 20 to develop a positive voltage at the discriminator D.C. output terminal 27. Whenever the A.C. signal input voltage applied is a higher frequency than the discriminator center frequency, the A.C. impedance of the inductive coil 20 is greater than the impedance of capacitor 19 and positive D.C. voltage is developed at output terminal 27.

Curve *a* of FIGURE 4 illustrates a D.C. voltage output curve of a discriminator according to my invention, such as the discriminator of FIGURE 2, and its comparison with a typical output curve *b* such as developed by many other frequency discriminators helps illustrate improved sensitivity at and about the center frequency. Further, it shows the ability, with A.C. impedance and resulting voltage drops varying oppositely across the two reactances with changing frequency, increasing with increasing frequency for one and decreasing with increasing frequency for the other, to hold discriminator output D.C. voltages through extended frequency ranges greatly removed from the center frequency of the discriminator. It should be noted that if the orientation of both diodes 22 and 23 were reversed, curve *a* would be reversed with negative D.C. voltage being developed at the discriminator output 27 with input frequencies below center frequency and positive D.C. voltage being developed with input frequencies above the center frequency.

Components and values used in a frequency discriminator according to the embodiment of FIGURE 2 with a resulting center frequency of approximately 12.5 k.c., with an extended output deviation of plus and minus 5 kc., with the output curve *a* ranging between +3 volts to −3 volts for a 15 volt A.C. input signal, include the following:

| | | |
|---|---|---|
| Capacitor 18 | μf | .1 |
| Capacitor 19 | pf | 6800 |
| Coil 20 | mh | 24 |
| Resistor 21 | ohms | 100 |
| Diodes 22 and 23 | | 1N916 |
| Capacitor 24 | μf | .1 |
| Resistors 25 and 26 | ohms | 22K |
| Capacitor 28 | μf | .1 |
| Resistor 29 | ohms | 1K |

Components and values used in a frequency discriminator according to the embodiment of FIGURE 1, including an A.C. input signal amplifying and coupling transistor 15 circuit, with a resulting center frequency of approximately 500 kc., having an operating frequency deviation of plus and minus 20 kc., and provide a frequency discriminator output characteristic curve *a*, include the following:

| | | |
|---|---|---|
| Capacitor 12 | μf | .01 |
| Resistors 13 and 14 | ohms | 10K |
| NPN transistor 15 | | 2N703 |
| Resistor 16 | ohms | 1K |
| Capacitor 18 | μf | 1 |
| Adjustable capacitor 19 | pf | 38–51 |
| Coil 20 | mh | 2 |
| Resistor 21 | ohms | 100 |
| Diodes 22 and 23 | | 1N916 |
| Capacitor 24 | pf | 220 |
| Resistors 25 and 26 | ohms | 47K |
| Capacitor 28 | μf | .1 |

The voltage divider formed with resistors 13, 14 and 16, particularly with resistor 16, between the voltage supply and the transistor collector output applied through capacitor 18 permits negative feedback signals to be fed back from the series resonant circuit and developed through the resistors 13 and 14 in correcting for and substantially counteracting harmonic distortion present in an A.C. signal input to the discriminator. Transistor collector impedance to ground is low and negative signal feedback is at a minimum when the capacitor 19 and coil 20 series subcircuit is at resonance with the fundamental input frequency. However, for any harmonic of the fundamental frequency the capacitor 19 and coil 20 circuit is not at resonance and impedance from the collector of transistor 15 to ground is considerably increased. This results in a much more significant negative signal feedback, useful for correcting for, and, in many cases, substantially counteracting undesired harmonic distortion content in A.C. signal inputs to the discriminator circuit of FIGURE 1. Furthermore, it simultaneously beneficially operates to stabilize bias and collector current of the input signal amplifying and coupling transistor 15.

FIGURE 3 illustrates addition of a capacitor 31 to a frequency discriminator, such as shown in FIGURE 1, to significantly improve phasing of corrective negative signal feedback and may be used where harmonic content distortion is likely to cause particularly acute problems. A capacitor 31 having a value of 22 pf. provides improved operating results as an optional addition in a frequency discriminator of FIGURE 1 utilizing the values that have been herein set forth.

Whereas this invention is here illustrated and described with respect to several embodiments thereof, it should be realized that various changes may be made without departing from the essential contributions to the art made by the teachings hereof.

I claim:

1. A frequency discriminator circuit having a series resonant inductive-capacitive tuned subcircuit connected at one end to a voltage potential reference and including a first capacitor and a coil; signal input coupling means for applying input A.C. signals to the other end of said inductive-capacitive tuned subcircuit; two diodes and a second capacitor connected serially between said input coupling means and said voltage potential reference with the cathode of one diode connected to the anode of the other diode, and with the common junction of the two diodes connected to the common junction between the capacitor and coil of said inductive-capacitive tuned subcircuit; and an impedance circuit connected across both diodes and having a D.C. output contact for application of the discriminator output as desired.

2. The frequency discriminator circuit of claim 1, wherein said signal input coupling means includes a signal coupling capacitor; said coupling capacitor being connected to the inductive-capacitive tuned subcircuit serially first to and through said first capacitor to said coil; and with the voltage potential reference being ground.

3. The frequency discriminator circuit of claim 1, wherein the impedance circuit connected across both diodes is a resistive circuit including two substantially equal resistive portions on opposite sides of the D.C. output contact.

4. The frequency discriminator circuit of claim 1, wherein said second capacitor is connected between one of said two diodes and said voltage potential reference, and the inductive-capacitive tuned circuit includes series connected resistive means.

5. The frequency discriminator circuit of claim 4, wherein said second capacitor is connected to said voltage potential reference through a resistor of said series connected resistive means.

6. The frequency discriminator circuit of claim 1, wherein said signal input coupling means includes an A.C. input signal amplifying transistor circuit; and a coupling capacitor between the A.C. input signal amplifying transistor circuit and the inductive-capacitive tuned subcircuit, and said transistor circuit includes voltage dividing means connected between a voltage supply and said voltage potential reference, and impedance means between said voltage supply and the transistor circuit connection with said coupling capacitor.

7. The frequency discriminator circuit of claim 6, wherein said voltage dividing means includes a first resistor connected between the voltage supply and the collector of said transistor, a second resistor connected between the collector and base of said transistor, and a third resistor connected between the transistor base and said voltage potential reference; and with the emitter of said transistor connected to said voltage potential reference.

8. The frequency discriminator circuit of claim 1, wherein said signal input coupling means includes an A.C. input amplifying circuit coupled to said inductive-capacitive tuned subcircuit; and negative signal feedback means for conveying negative feedback signals from said series resonant inductive-capacitive tuned subcircuit and for developing a negative feedback signal at the A.C. input to said A.C. signal amplifying circuit.

9. A frequency discriminator circuit having a series resonance inductive-capacitive tuned subcircuit connected at one end to ground and including a first capacitor and a coil; an input signal amplifying and coupling circuit having a transistor with the base coupled for receiving the input signal, its collector connected to a positive voltage supply through a first resistor, a second resistor connected between the collector and the base of the transistor, a third resistor connected between the base and ground, the emitter connected to ground, and a second capacitor connected between the collector of the transistor and the inductive-capacitive tuned subcircuit; two diodes and a third capacitor connected serially between said second capacitor and ground with the cathode of one diode connected to the anode of the other diode, and with the common junctions of the diodes connected to the common junction between the capacitor and the coil of said inductive-capacitive tuned subcircuit; and an impedance circuit connected across both diodes including a D.C. output contact for discriminator output connection as desired.

References Cited by the Examiner

UNITED STATES PATENTS

| | | | |
|---|---|---|---|
| 2,671,851 | 3/54 | Houck | 329—137 X |
| 2,911,527 | 11/59 | Southeimer | 329—140 |

ROY LAKE, *Primary Examiner.*

ALFRED L. BRODY, *Examiner.*